(12) United States Patent
Sun et al.

(10) Patent No.: US 8,850,370 B2
(45) Date of Patent: *Sep. 30, 2014

(54) METHOD OF MANUFACTURING SEMICONDUCTOR CIRCUIT STRUCTURE

(71) Applicant: United Microelectronics Corporation, Hsinchu (TW)

(72) Inventors: Chia-Chen Sun, Kaohsiung (TW);
Shih-Chieh Hsu, New Taipei (TW);
Yi-Chung Sheng, Tainan (TW);
Sheng-Yuan Hsueh, Tainan (TW);
Yao-Chang Wang, Tainan (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/094,806

(22) Filed: Dec. 3, 2013

(65) Prior Publication Data

US 2014/0089869 A1 Mar. 27, 2014

Related U.S. Application Data

(62) Division of application No. 12/547,521, filed on Aug. 26, 2009, now Pat. No. 8,624,398.

(51) Int. Cl.
*G06F 17/50* (2006.01)
*H01L 23/528* (2006.01)

(52) U.S. Cl.
CPC .......... *G06F 17/5081* (2013.01); *H01L 23/528* (2013.01)

USPC .............. 716/55; 716/54; 716/118; 716/119; 716/122

(58) Field of Classification Search
CPC .......................... G06F 17/5081; H01L 23/528
USPC .............................. 716/54, 55, 118, 119, 122
See application file for complete search history.

(56) References Cited

U.S. PATENT DOCUMENTS

| 4,234,888 | A | 11/1980 | Calhoun et al. |
| 5,598,010 | A | 1/1997 | Uematsu |
| 5,773,857 | A | 6/1998 | Ura |
| 6,309,956 | B1 | 10/2001 | Chiang |
| 7,525,186 | B2 | 4/2009 | Kim |
| 8,164,195 | B2 | 4/2012 | Chi |
| 8,624,398 | B2 * | 1/2014 | Sun et al. ....................... 257/773 |
| 2005/0035457 | A1 | 2/2005 | Tomita et al. |
| 2011/0154273 | A1 * | 6/2011 | Aburada et al. ................. 716/52 |

* cited by examiner

*Primary Examiner* — Sun Lin
(74) *Attorney, Agent, or Firm* — Ding Yu Tan

(57) ABSTRACT

A layout method of a semiconductor circuit is provided. The layout method is firstly putting a plurality of circuit patterns on a substrate, wherein a first distance is the largest distance between any one of the circuit patterns and one of other circuit patterns adjacent thereto. The layout method is then determining whether the first distance is larger than a first critical value. Later, when the first distance is larger than the first critical value, at least a closed loop dummy pattern is putted in one of the areas corresponding to the first distance between the pair of the circuit patterns. The closed loop dummy pattern is putted in a same layer with the circuit patterns, surrounds between the pair of circuit patterns and is insulated from the circuit patterns.

18 Claims, 13 Drawing Sheets

METHOD OF MANUFACTURING SEMICONDUCTOR CIRCUIT STRUCTURE

CROSS-REFERENCE TO RELATED APPLICATION

This is a divisional application of an application Ser. No. 12/547,521, filed on Aug. 26, 2009, now U.S. Pat. No. 8,624,398, issued on Jan. 7, 2014. The entirety of the above-mentioned patent application is hereby incorporated by reference herein and made a part of this specification.

FIELD OF THE INVENTION

The present invention relates to a layout method, and more particularly to a layout method of a semiconductor circuit structure which can avoid damaging from stresses.

BACKGROUND OF THE INVENTION

For increasing the integrated level of the semiconductor, circuit patterns in multi-layers are designed to increase the amount of elements held in a single chip. The circuit patterns employ metal line structures, such as plugs or contacts, to be connected with each other for forming a whole loop. Furthermore, for not contacting the circuit patterns in the multi-layers with each other, which do not connect the metal lines, dielectric layers are generally formed between the circuit patterns in the multi-layers to separate the circuit patterns.

FIG. 1 is a schematic view of a conventional semiconductor circuit structure. Referring to FIG. 1, the semiconductor circuit structure 100 mainly includes a substrate 110 and a plurality of circuit patterns 120 disposed on the substrate 110. Since a position distribution of the circuit patterns 120 are determined by the semiconductor manufacturing standards and the property of the circuit structure, distances between the circuit patterns 120 are different.

However, when the distances between the adjacent circuit patterns 120 are too large, that is, a great insulating area 130 is formed between the adjacent circuit patterns 120, stresses born by the semiconductor circuit structure 100 in manufacturing are apt to concentrate at junctions of the insulating area 130 and the circuit patterns 120, such that the circuit patterns 120 are apt to be disrupted or distorted.

SUMMARY OF THE INVENTION

The present invention is also directed to a layout method of a semiconductor circuit structure, which can protect circuit patterns from being damaged by stresses.

A layout method of a semiconductor circuit is provided. The layout method is firstly putting a plurality of circuit patterns on a substrate, wherein a first distance is the largest distance between any one of the circuit patterns and one of other circuit patterns adjacent thereto. The layout method is then determining whether the first distance is larger than a first critical value. Later, when the first distance is larger than the first critical value, at least a closed loop dummy pattern is putted in one of the areas corresponding to the first distance between the pair of the circuit patterns. The closed loop dummy pattern is putted in a same layer with the circuit patterns, surrounds between the pair of circuit patterns and is insulated from the circuit patterns.

In an exemplary embodiment of the present invention, at least a second distance is between any one of the pair of circuit patterns and the circuit patterns adjacent thereto, and the second distance is less than the first critical value. The layout method further comprises determining whether the second distance is larger than a second critical value. Wherein, when the second distance is larger than the second critical value, the layout method further comprises putting at least a linear pattern corresponding to the second distance, and the linear pattern is connected with the closed loop dummy pattern.

In an exemplary embodiment of the present invention, the layout method of the semiconductor circuit further comprises determining whether a width of the area surrounded by the closed loop dummy pattern is larger than the first critical value. When the width of the area surrounded by the closed loop dummy pattern is larger than the first critical value, at least a dummy pattern is putted in one of the area surrounded by the closed loop dummy pattern.

In an exemplary embodiment of the present invention, the step of putting the dummy pattern further comprises connecting the dummy pattern with the closed loop dummy pattern.

In an exemplary embodiment of the present invention, the step of putting the dummy pattern further comprises separating the dummy pattern from the closed loop dummy pattern.

In an exemplary embodiment of the present invention, the dummy pattern may be formed in a configuration of ringed-shape, polygon-shape or irregular-shapes.

In an exemplary embodiment of the present invention, when the first distance between the at least a pair of circuit patterns is larger than the first critical value, the layout method further comprises putting at least one dummy pattern between the pair of the circuit patterns before putting the closed loop dummy pattern. The subsequent putted closed loop dummy pattern surrounds the dummy pattern.

In an exemplary embodiment of the present invention, the layout method further comprises putting at least one dummy pattern in the area surrounded by the closed loop dummy pattern after putting the closed loop dummy pattern.

In an exemplary embodiment of the present invention, before putting the closed loop dummy pattern, the layout method further comprises determining whether the first distance is larger than a third critical value. When the first distance is larger than the third critical value, a plurality of closed loop dummy patterns are disposed in the area corresponding to the first distance between the pair of circuit patterns, and distances between the closed loop dummy patterns are less than the first critical value.

In an exemplary embodiment of the present invention, the layout method further comprises putting at least a vacancy at the closed loop dummy pattern.

A layout method of a semiconductor circuit is provided. The layout method is firstly putting a plurality of circuit patterns within a dielectric layer disposed on a substrate. The layout method is then putting at least one closed loop dummy pattern in the same dielectric layer, wherein the at least one closed loop dummy pattern is put in a region of no circuit patterns and is electrically insulated from all the circuit patterns within the same dielectric layer.

In an exemplary embodiment of the present invention, the layout method further comprises putting another closed loop dummy pattern.

In an exemplary embodiment of the present invention, the layout method further comprises connecting the at least one closed loop dummy pattern and the another closed loop dummy pattern.

In an exemplary embodiment of the present invention, the layout method further comprises putting a dummy pattern inside the at least one closed loop dummy pattern.

In an exemplary embodiment of the present invention, the layout method further comprises putting a dummy pattern outside the at least one closed loop dummy pattern.

In an exemplary embodiment of the present invention, the layout method further comprises connecting the dummy pattern and the at least one closed loop dummy pattern.

In an exemplary embodiment of the present invention, the at least one closed loop dummy pattern is formed in a configuration of ringed-shape, polygon-shape or irregular-shapes.

In an exemplary embodiment of the present invention, the layout method further comprises putting at least a vacancy into the at least one closed loop dummy pattern.

The present invention disposes the closed loop dummy pattern between the adjacent circuit patterns, and the closed loop dummy pattern is electrically insulated from other elements, to protect the circuit patterns from being damaged by stresses. Therefore, the present invention can effectively improve the mechanical strength of the semiconductor circuit structure, and increase the process yield.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
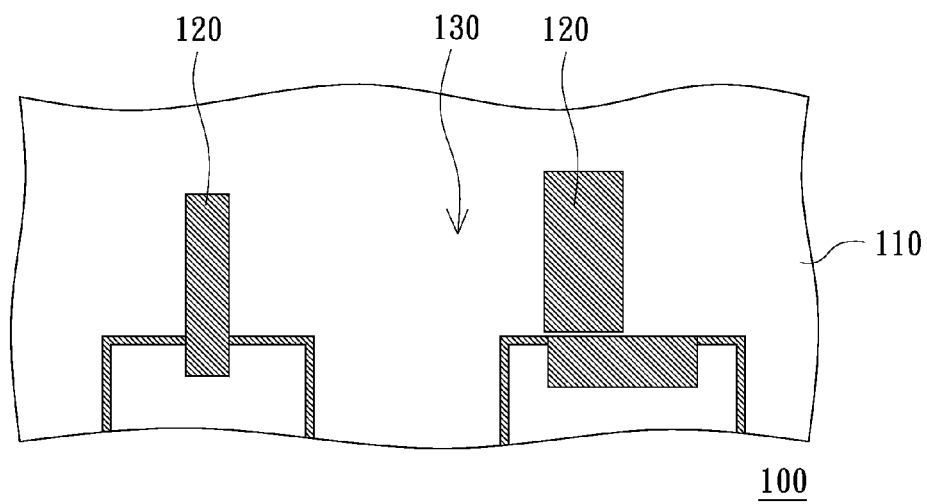
FIG. 1 is a schematic view of a conventional semiconductor circuit structure.
Figure 2A:
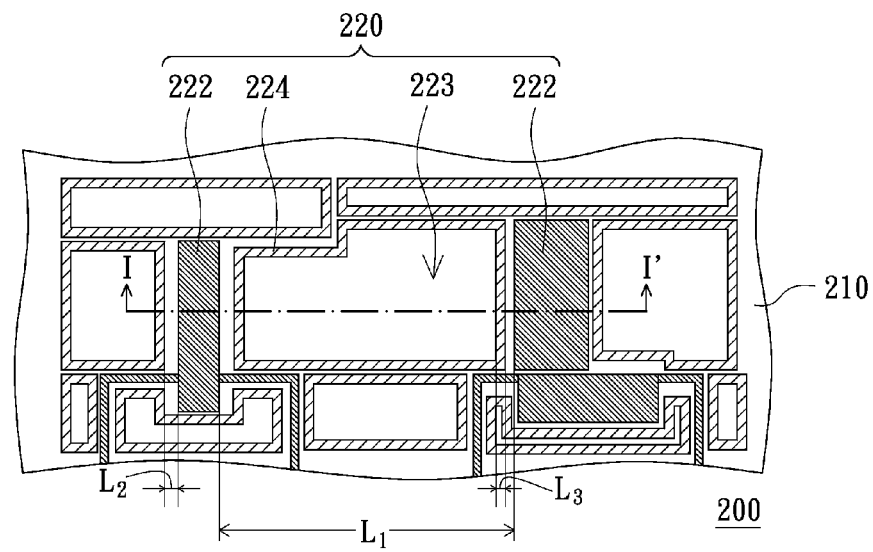
FIG. 2A is a schematic view of a semiconductor circuit structure in accordance with an exemplary embodiment of the present invention.
Figure 2B:
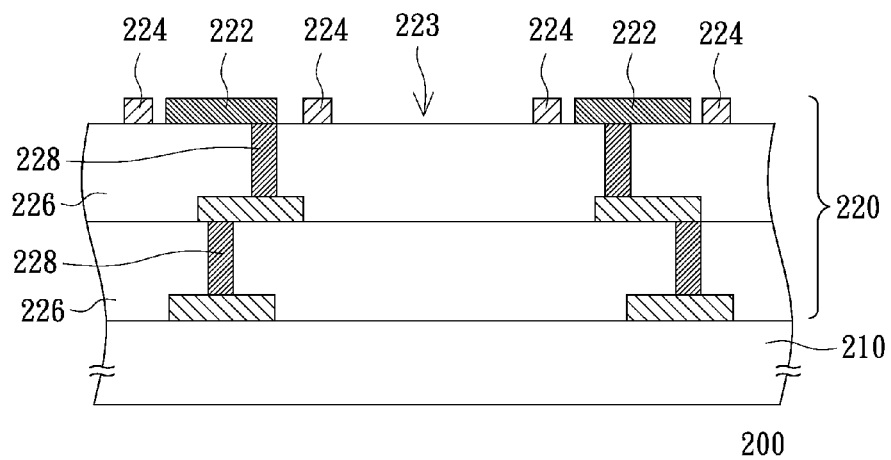
FIG. 2B is a schematic cross-sectional view of the semiconductor circuit structure of FIG. 2A along a line I-I'.

FIG. 2A is a schematic view of a semiconductor circuit structure in accordance with an exemplary embodiment of the present invention, and FIG. 2B is a schematic cross-sectional view of the semiconductor circuit structure of FIG. 2A along a line I-I'. Referring to FIGS. 2A and 2B, the semiconductor circuit structure 200 includes a substrate 210 and an interconnect structure 220. The interconnect structure 220 is disposed on the substrate 210, and includes a plurality of circuit patterns 222 and at least a closed loop dummy pattern 224. The closed loop dummy pattern (also referred to as the closed loop pattern) 224 surrounds between the adjacent circuit patterns 222. In this exemplary embodiment, the closed loop dummy pattern 224 may surrounds between the two adjacent circuit patterns 222 along contours of the adjacent circuit patterns 222.

Figure 3:
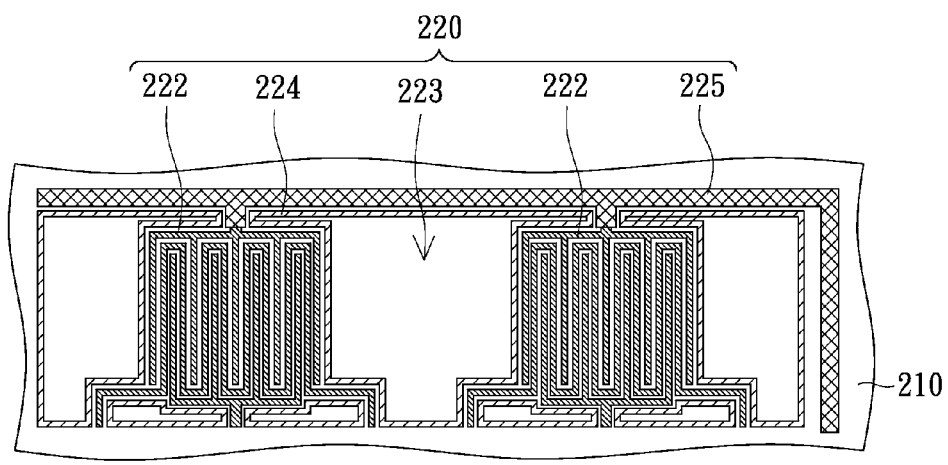
FIG. 3 is a schematic view of a semiconductor circuit structure in accordance with another exemplary embodiment of the present invention.

It should be noted that, the circuit patterns 222 are elements with electrical functions of the semiconductor circuit structure 200, and shapes thereof are determined in actual needs and not limited in the present invention. Furthermore, the circuit patterns 222 may be independent circuits, and also may be connected with each other via another circuit pattern 225 as shown in FIG. 3. The closed loop dummy pattern 224 has not any electrical function in the semiconductor circuit structure 200. That is, the closed loop dummy pattern 224 is electrically insulated from the circuit patterns 222 and any other element.

In addition, distances between the closed loop dummy pattern 224 and the adjacent circuit patterns 222 are determined by the different manufacturing generations (such as, 0.18 um generation, 0.13 um generation or 90 nm generation, etc.) and different element layers (such as, gate layer, interconnect metal layer or metal-plug layer, etc.). The distances thereof may be equal or larger than the minimum rule of the element layer of the manufacturing generation. In this exemplary embodiment, a minimum distance between the closed loop dummy pattern 224 and the circuit patterns 222 may be 70 micrometers, but it is not used to limit the present invention. Furthermore, a width of the closed loop dummy pattern 224 may be equal to those of the circuit patterns 222. Alternatively, the width of closed loop dummy pattern 224 may be less than or larger than those of the circuit patterns 222. The width of the closed loop dummy pattern 224 may be not a definite value. For example, different closed loop dummy patterns 224 may have different widths. Alternatively, widths in different disposing directions of a same closed loop dummy pattern 224 may be different.

Figure 4:
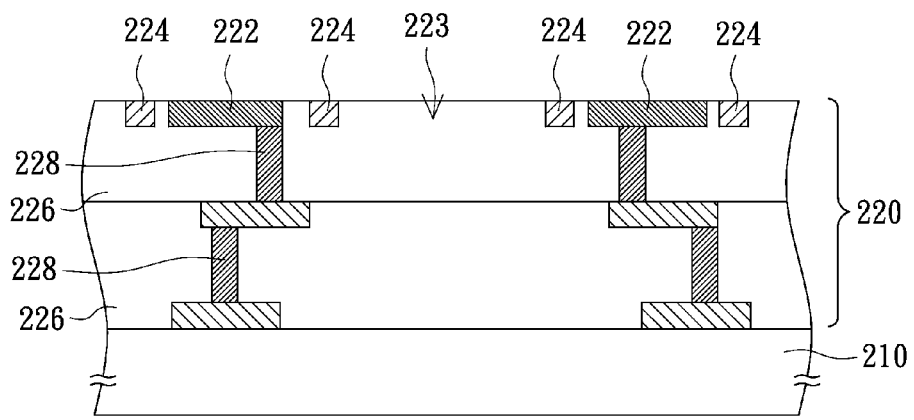
FIG. 4 is a schematic cross-sectional view of the semiconductor circuit structure of FIG. 2A along a line I-I' in accordance with another exemplary embodiment of the present invention.

In detail, the interconnect structure 220 further includes a plurality of dielectric layers 226 and a plurality of conductive plugs 228. The conductive plugs 228 are formed in the dielectric layers 226 to electrically connect the conductive films in the different layers with each other. The circuit patterns 222 are formed on one of the dielectric layers 226, or formed in the dielectric layers 226 (as shown in FIG. 4) to electrically connect other semiconductor elements (not shown) via the conductive plugs 228. The insulating area 223 between the adjacent circuit patterns 222 is a part of the dielectric layers 226.

It should be noted that, the closed loop dummy pattern 224 and the circuit patterns 222 are manufactured in a same process. That is, the closed loop dummy pattern 224 and the circuit patterns 222 are arranged in a same layer of the interconnect structure 220, and are made of a same material. In detail, the closed loop dummy pattern 224 may be made of a conductive material same to those of the circuit patterns 222, such as metal or poly-silicon.

From FIG. 2A it can be seen that, this exemplary embodiment disposes the closed loop dummy pattern 224 between the adjacent circuit patterns 222. Thus, when the semiconductor circuit structure 200 bears heat stresses or mechanical stresses, most of the stresses will be concentrated at the junctions between the insulating area 223 and the closed loop dummy pattern 224 to avoid the stresses disrupting or distorting the circuit patterns 222.

Figure 5:
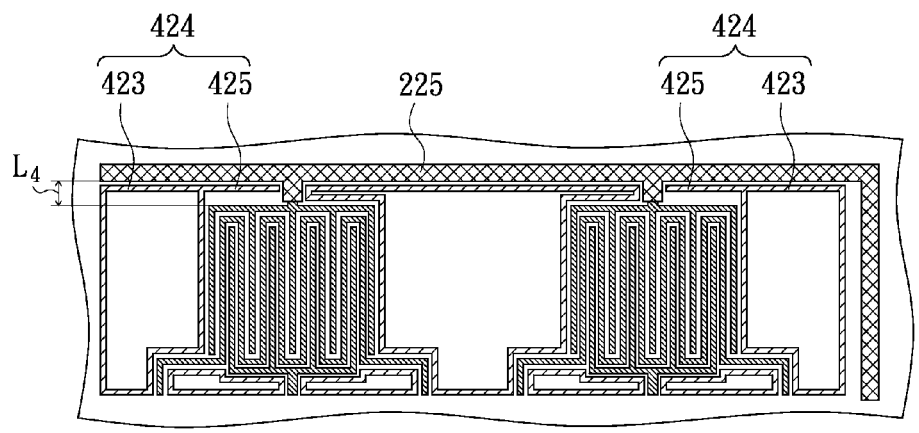
FIG. 5 is a schematic view of a semiconductor circuit structure in accordance with other exemplary embodiment of the present invention.

Specially, if there is further a distance between the adjacent circuit patterns 222 less than the space of the closed loop dummy pattern 224 occupied, a linear pattern 425 as shown in FIG. 5 may be formed therein to connect to the closed loop dummy pattern 224.

Figure 6:
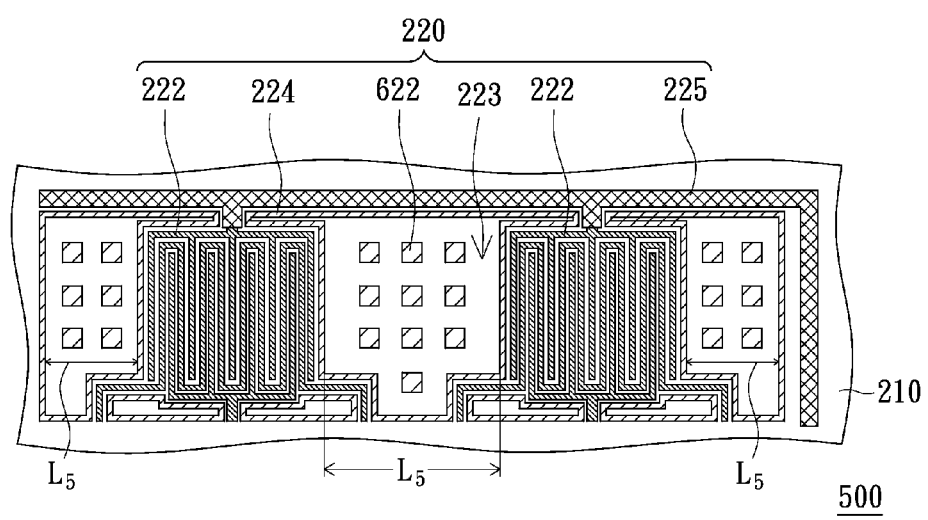
FIG. 6 is a schematic view of a semiconductor circuit structure in accordance with other exemplary embodiment of the present invention.

FIG. 6 is a schematic view of a semiconductor circuit structure in accordance with another exemplary embodiment of the present invention. Referring to FIG. 6, the semiconductor circuit structure 600 is similar to the semiconductor circuit structure 200 of the above exemplary embodiment, and the following will only describe differences therebetween.

The interconnect structure 220 of the semiconductor circuit structure 600 further includes at least a dummy pattern 622. The dummy pattern 622 is disposed in the area surrounded by the closed loop dummy pattern 224 to further solve the problem of stresses concentration when the insulating area 223 between the circuit patterns 222 is large, or avoid the loading effect of the etching process, the photo lithography, or the chemical mechanical planarization caused by the densities of the patterns are too larger. The dummy pattern 622 is electrically insulated from the circuit patterns 222 and other elements.

Figure 7:
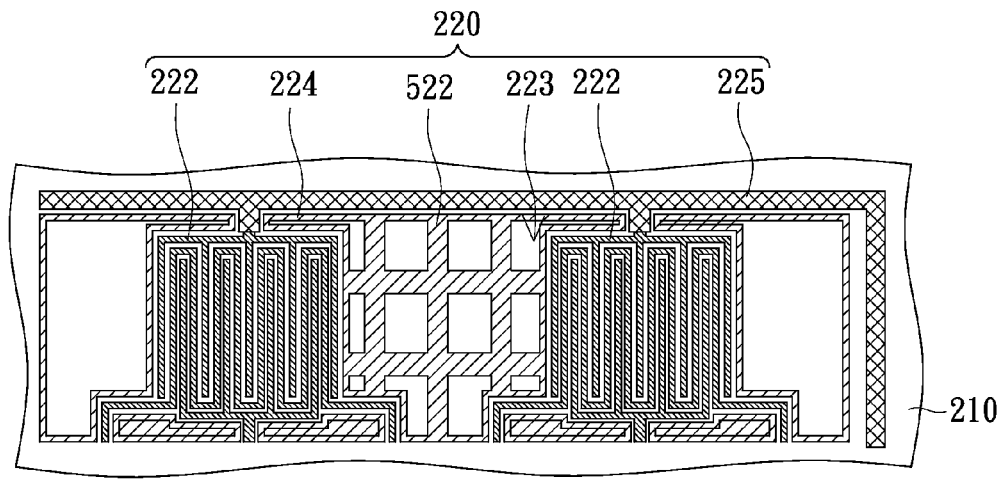
FIG. 7 is a schematic view of a semiconductor circuit structure in accordance with other exemplary embodiment of the present invention.
Figure 8:
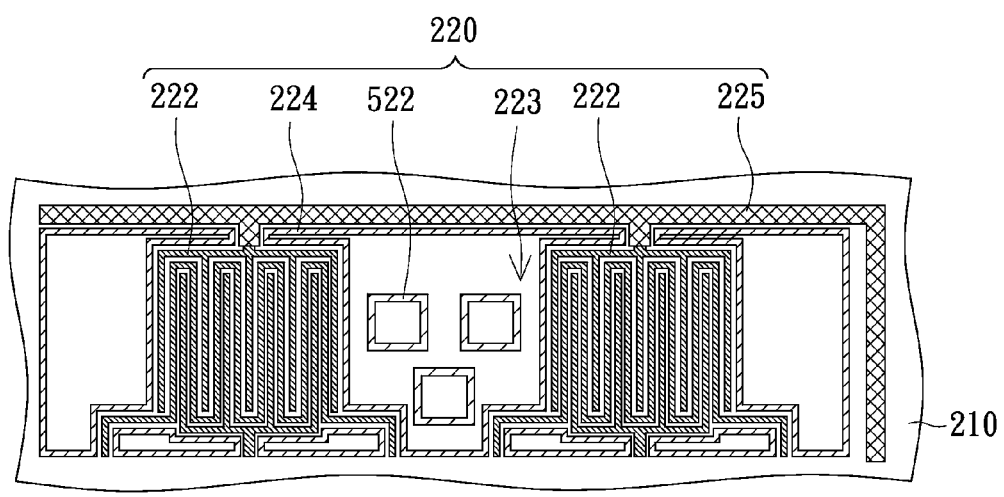
FIG. 8 is a schematic view of a semiconductor circuit structure in accordance with other exemplary embodiment of the present invention.

In this exemplary embodiment, the interconnect structure 220 includes a plurality of dummy patterns 622, and the dummy patterns 622 may be any polygon-shape, such as a square as shown in FIG. 6 or a rectangle as shown in FIG. 7. Of course, the dummy patterns 622 also may be a ringed-shape (as shown in FIG. 8) or other irregular shapes. The present invention does not limit the contour and the arrange mode of the dummy patterns 622.

Furthermore, the dummy patterns 622 in the area surrounded by the closed loop dummy pattern 224 may be separated from the closed loop dummy pattern 224 (as shown in FIG. 6), also may be connected with the closed loop dummy pattern 224 (as shown in FIG. 7). The persons skilled in the arts can determine the dummy patterns 622 and the closed loop dummy pattern 224 in actual needs, and they are not limited in the present invention.

Figure 9:
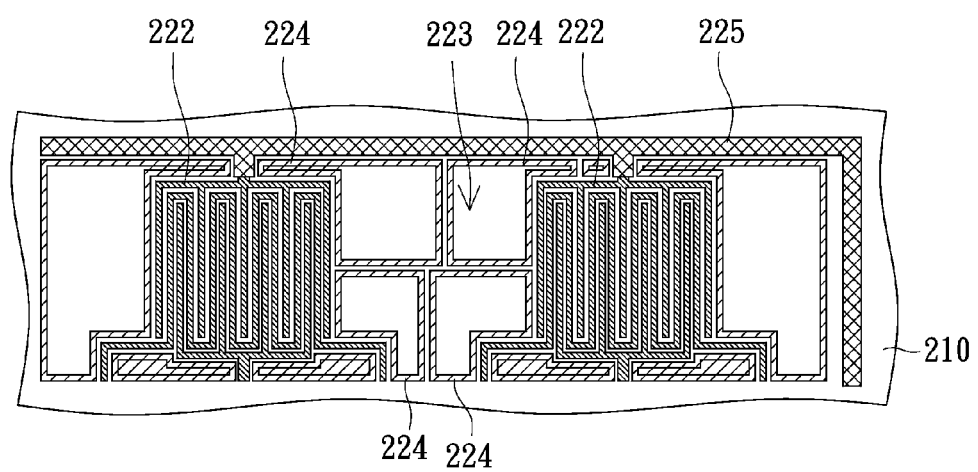
FIG. 9 is a schematic view of a semiconductor circuit structure in accordance with other exemplary embodiment of the present invention.

Except employing the dummy patterns 622 to further solve the problem of stresses concentration in the above embodiment, another exemplary embodiment of the present invention further can dispose a plurality closed loop dummy patterns 224 between the two adjacent circuit patterns 222 as shown in FIG. 9. The closed loop dummy patterns 224 surrounds between the two adjacent circuit patterns 222 along the contours of the adjacent circuit patterns 222 to avoid concentrating the stresses born by the semiconductor circuit structure 900 in manufacturing at the junctions between the insulating area 223 and the circuit patterns 222.

For making the persons skilled in the arts more understand the present invention, the following embodiments will describe layout methods of semiconductor circuits of the present invention cooperated with FIGS.

Figure 10:
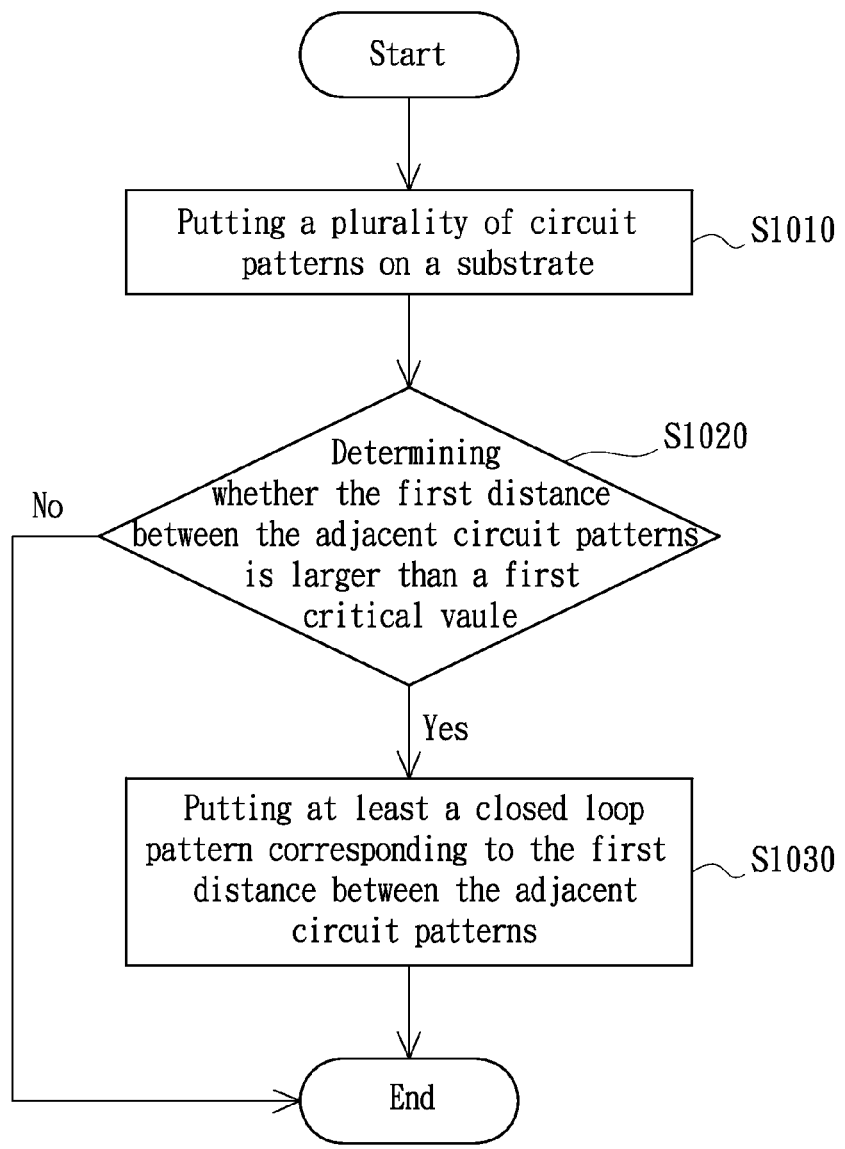
FIG. 10 is an implementing flow chart of a layout method of a semiconductor circuit in accordance with an exemplary embodiment of the present invention.

FIG. 10 is an implementing flow chart of a layout method of a semiconductor circuit in accordance with an exemplary embodiment of the present invention. Referring to FIGS. 2A and 10 together, the layout method of the semiconductor circuit of this exemplary embodiment is firstly putting a plurality of circuit patterns 222 on a substrate 210 as shown in a step S1010. Wherein, a first distance L1 is the largest distance between the adjacent circuit patterns 222. It should be noted that, the distance between the adjacent circuit patterns 222 is a minimum distance between the two adjacent circuit patterns 222 at a horizontal line. The layout method thereof is then determining whether the first distance L1 s larger than a first critical value as shown in a step S1020.

In detail, when the first distance L1 between the adjacent circuit patterns are less than the first critical value, it represents that the stresses born by the semiconductor circuit structure 200 in manufacturing are not apt to be concentrated at the junctions between the insulating area 223 and the circuit patterns 222. On the contrary, when the first distance L1 between the adjacent circuit patterns 222 is larger than the first critical value, it represents that the stresses born by the semiconductor circuit structure 200 in manufacturing are apt to be concentrated at the junctions between the insulating area 223 and the circuit patterns 222. Therefore, at least a closed loop dummy pattern (or closed loop pattern) 224 needs to be putted between the pair of the circuit patterns 222, which is shown in a step S1030. Therefore, the stresses born by the semiconductor circuit structure 200 in manufacturing will be transferred to the junction between the insulating area 223 and the closed loop dummy pattern 224 to avoid the stresses damaging the circuit pattern 222.

From the above, the minimum distance L2 between the closed loop dummy pattern 224 and the circuit patterns 222 is determined by the different manufacturing generations (such as, 0.18 um generation, 0.13 um generation or 90 nm generation, etc.) and the different element layers (such as, gate layer, interconnect metal layer or metal-plug layer, etc.), and is not limited in the present invention. Therefore, in an exemplary embodiment, the first critical value may be two times of the width L3 of the closed loop dummy pattern 224 adding three times of the minimum distance L2.

Figure 11:
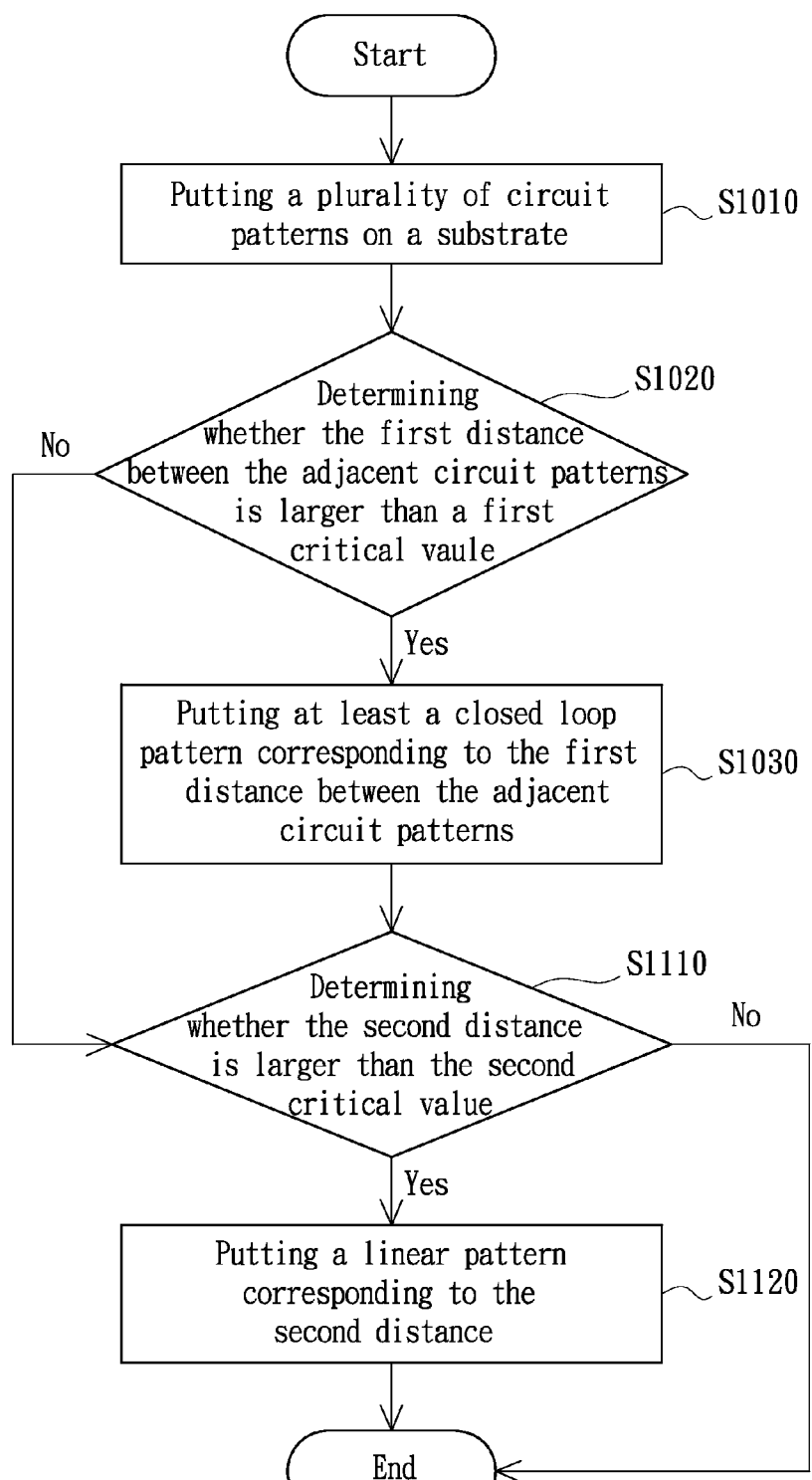
FIG. 11 is an implementing flow chart of a layout method of a semiconductor circuit in accordance with another exemplary embodiment of the present invention.

It should be noted that, referring to FIGS. 5 and 11, if there is the first distance L1 between the adjacent circuit patterns 222 larger than the first critical value, and there is also a second distance L4 less than the first critical value between one of the pair of the circuit patterns 222 and the adjacent circuit pattern 225, the layout method thereof is further determining whether the second distance L4 is larger than the second critical value after disposing the closed loop dummy pattern 224, which is shown in a step S1110. In an exemplary embodiment, the second critical value may be a time of the width of the linear pattern 425 adding two times of the minimum distance L2. Then when the second distance L4 is larger than the second critical value, the layout method will comprises the step of putting the linear pattern 425 corresponding to the second distance L4, which is shown in a step S1120.

On the other hand, if the first distance L1 between the adjacent circuit patterns 222 is smaller than the first critical value, the step S1110 also can be performed for determining whether the second distance L4 is larger than the second critical value, and then the step S1120 is performed while the second distance L4 is larger than the second critical value.

Figure 12:
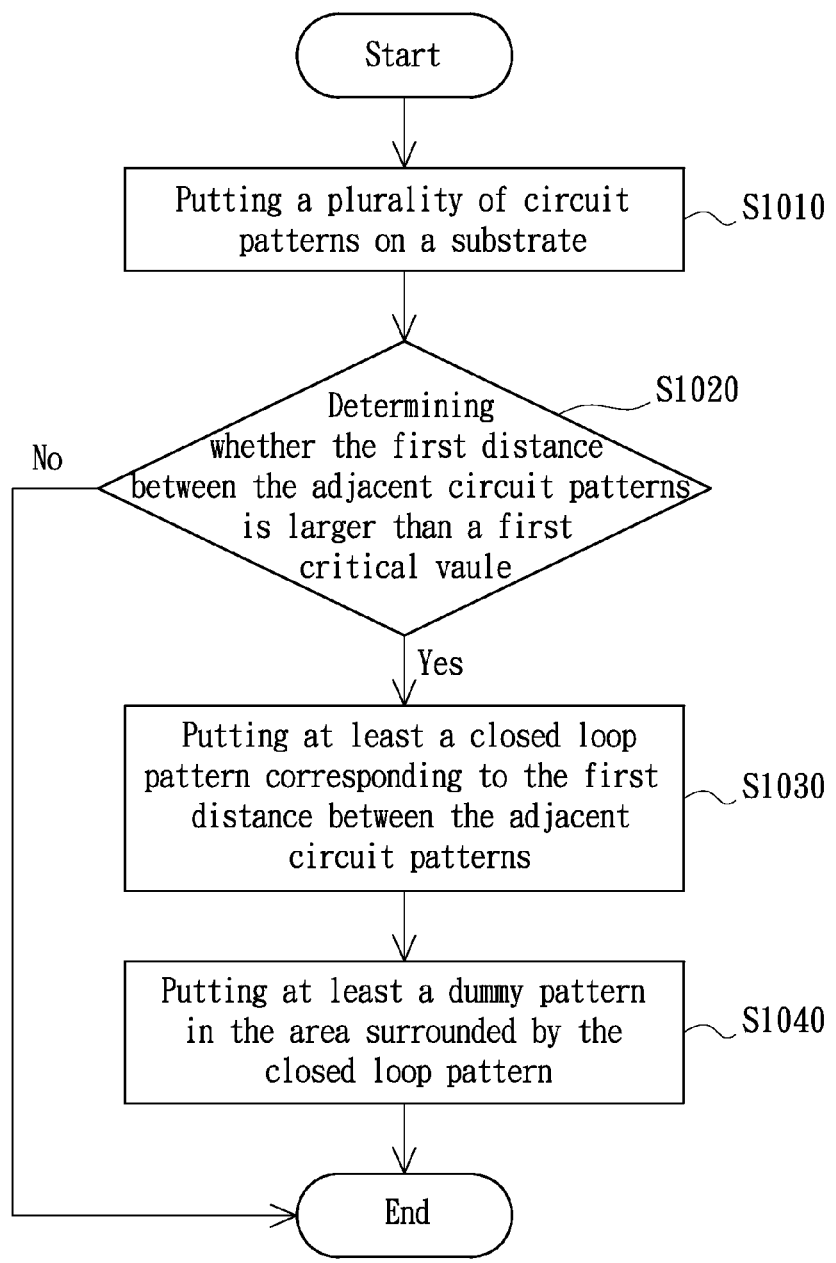
FIG. 12 is an implementing flow chart of a layout method of a semiconductor circuit in accordance with other exemplary embodiment of the present invention.

FIG. 12 is an implementing flow chart of a layout method of a semiconductor circuit in accordance with another exemplary embodiment of the present invention. Referring to FIGS. 12 and 6, specially, for further solving the problem of stresses concentration, this exemplary embodiment still can put at least a dummy pattern 622 in the area surrounded by the closed loop dummy pattern 224 after putting the closed loop dummy pattern 224, which is shown in a step S1040.

Figure 13:
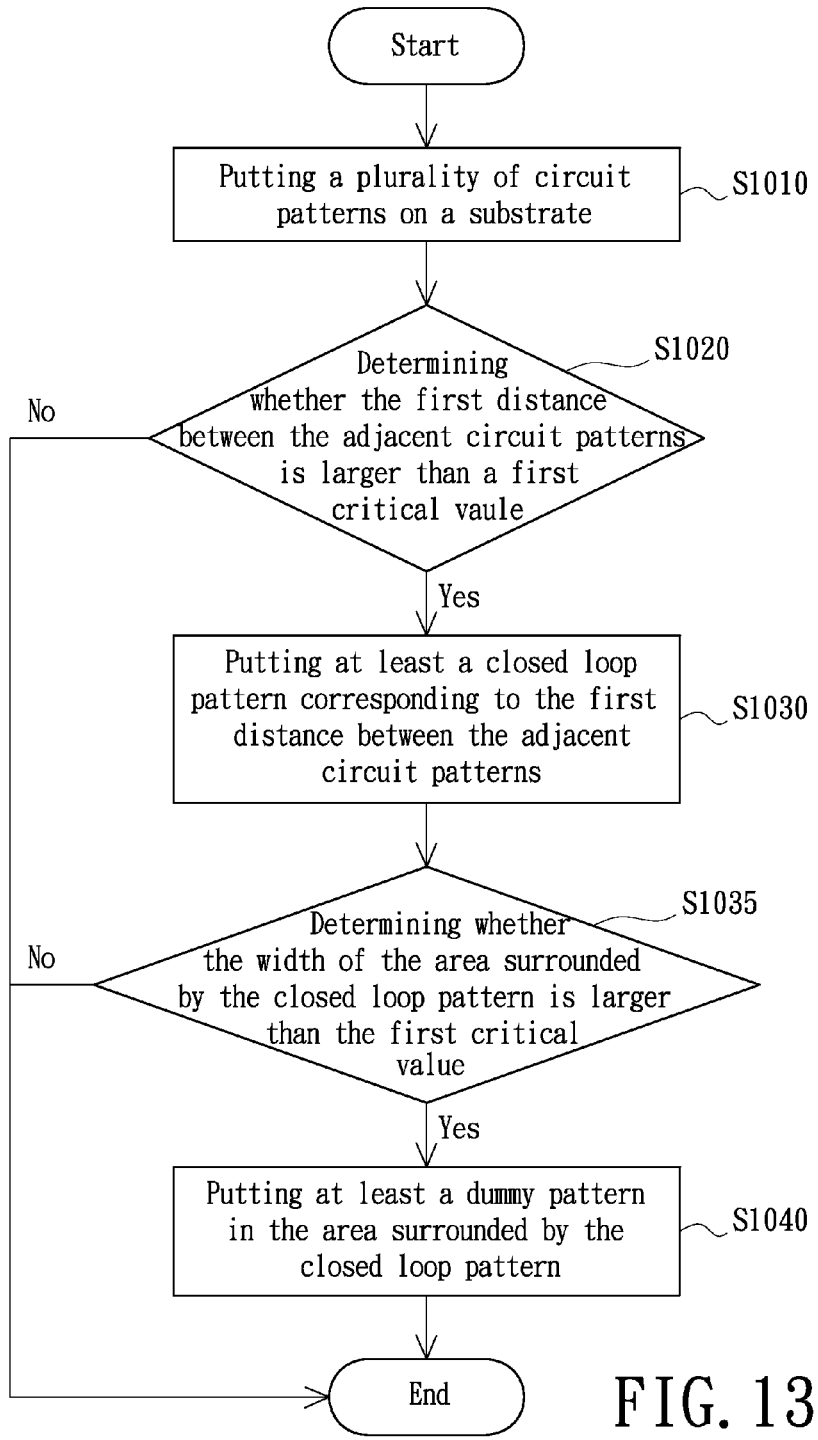
FIG. 13 is an implementing flow chart of a layout method of a semiconductor circuit in accordance with other exemplary embodiment of the present invention.

FIG. 13 is an implementing flow chart of a layout method of a semiconductor circuit in accordance with other exemplary embodiment of the present invention. Referring to FIGS. 13 and 6 together, this exemplary embodiment still can determine whether the width L5 of the area surrounded by the closed loop dummy pattern 224 is larger than the first critical value before putting the dummy pattern 622, which is shown in a step S1035. When the width L5 of the area surrounded by the closed loop dummy pattern 224 is larger than the first critical value, the dummy pattern 622 is putted in the area surrounded by the closed loop dummy pattern 224, which is shown in a step S1040.

It should be noted that, the present invention does not limit the shape of the dummy pattern 622, and the shape thereof may be any polygon-shape (such as the quadrangle as shown in FIGS. 6 and 7) or a ringed-shape (as shown in FIG. 8) or other irregular shapes. In addition, the dummy pattern 622 may be connected with the closed loop dummy pattern 224 (as shown in FIG. 7), or be separated from the closed loop dummy pattern (as shown in FIG. 6).

In addition, referring to FIG. 6 again, other exemplary embodiment may firstly put the dummy pattern 622 in the insulating area 223 between the adjacent circuit patterns 222, and then put the closed loop dummy pattern 224 to surround the dummy pattern 622 therein. In other words, the present invention does not limit the sequence of putting the dummy pattern 622 and the closed loop dummy pattern 224 in the layout process.

Referring to FIG. 9 again, it should be noted that, if the insulating area 223 between the adjacent circuit patterns 222 is too large, a plurality of closed loop dummy patterns 224 may be putted in the insulating area 223 to further decrease the concentration of the stresses of the semiconductor circuit structure 200. The following exemplary embodiments will describe the layout method of the semiconductor circuit in accordance with another exemplary embodiment of the present invention cooperated with FIGS.

Figure 14:
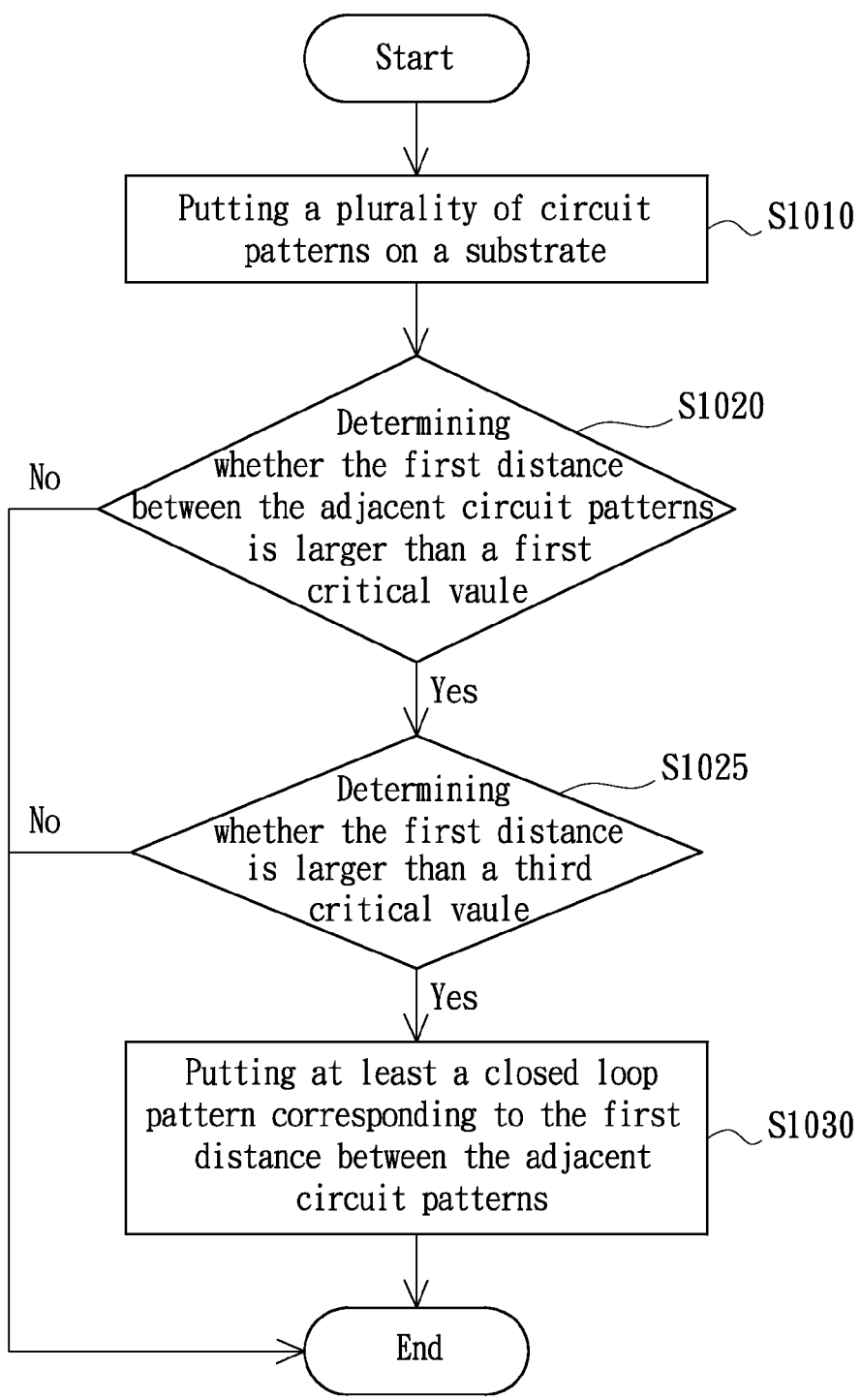
FIG. 14 is an implementing flow chart of a layout method of a semiconductor circuit in accordance with other exemplary embodiment of the present invention.

FIG. 14 is an implementing flow chart of a layout method of a semiconductor circuit in accordance with another exemplary embodiment of the present invention. Referring to FIGS. 14 and 9, if determining the first distance L1 between the adjacent circuit patterns 222 is larger than the first critical value in the step S1020, the layout method is then determining whether the first distance L1 is larger than a third critical value, which is shown in a step S1025. When the first distance L1 is larger than the third critical value, this exemplary embodiment will put a plurality of closed loop dummy patterns 224 in the the areas corresponding to the first distance L1 when performing the step S1030. The distances of the closed loop dummy patterns 224 are less than the first distance L1, and the minimum distance L2 between the closed loop dummy patterns 224 and between the closed loop dummy patterns 224 and the circuit patterns 222 is determined by the different manufacturing generations (such as, 0.18 um generation, 0.13 um generation or 90 nm generation, etc.) and the different element layers (such as, gate layer, interconnect metal layer or metal-plug layer, etc.), and is not limited in the present invention.

Figure 15:
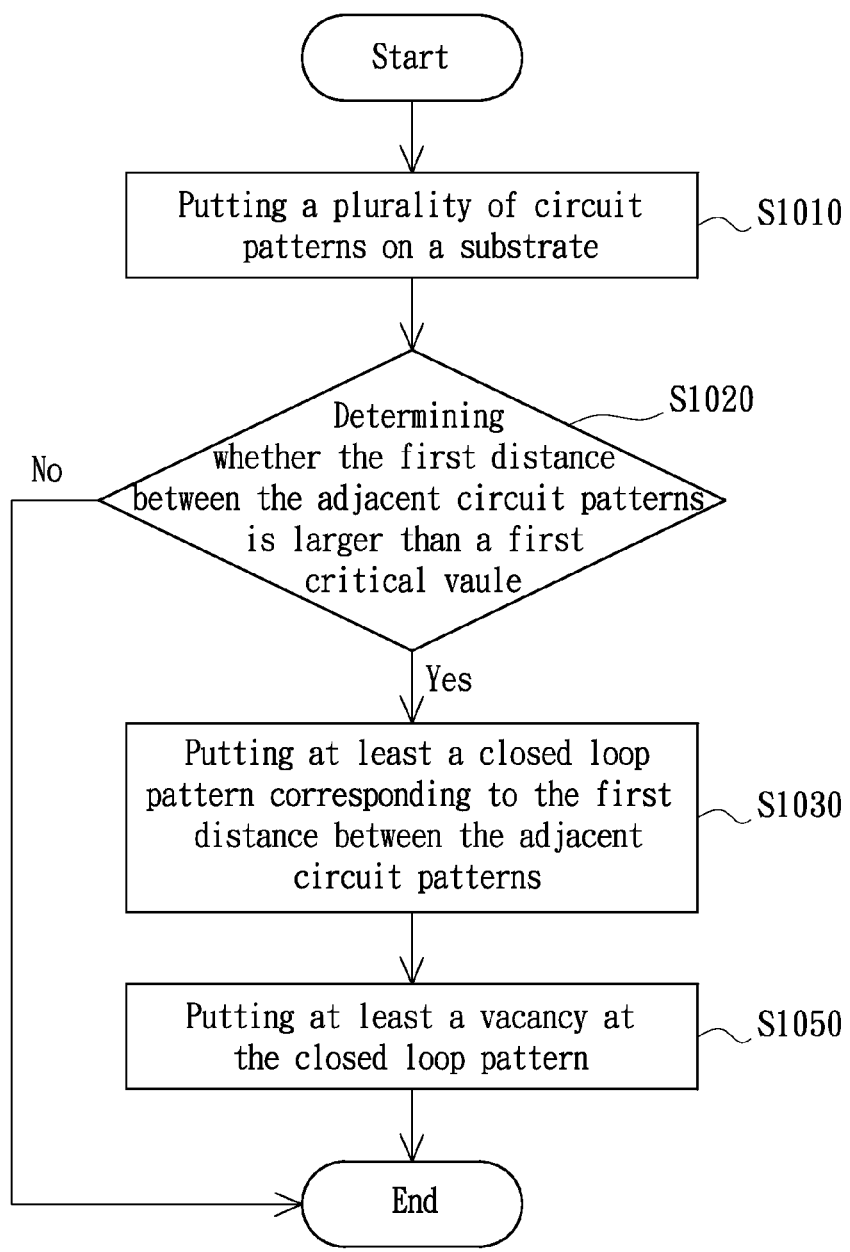
FIG. 15 is an implementing flow chart of a layout method of a semiconductor circuit in accordance with other exemplary embodiment of the present invention.
Figure 16:
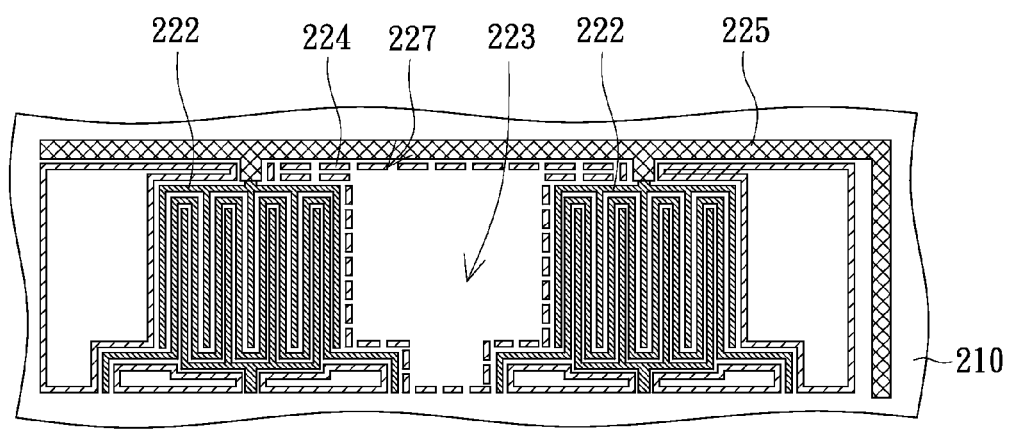
FIG. 16 is a schematic layout view of a semiconductor circuit structure in accordance with other exemplary embodiment of the present invention.

FIG. 15 is an implementing flow chart of a layout method of a semiconductor circuit in accordance with other exemplary embodiment of the present invention, and FIG. 16 is a schematic layout view of the semiconductor circuit structure in accordance with other exemplary embodiment of the present invention. Referring to FIGS. 15 and 16 together, this exemplary embodiment still can put at least a vacancy 223 at the closed loop dummy pattern 224 as shown in a step S1050 after performing the step S1030 to put the closed loop dummy pattern 224, such that the closed loop dummy pattern 224 is a discontinuous pattern. The size of the vacancy 227 may be determined in actual needs.

It should be noted that, the layout method can be applied in the exemplary embodiment of the circuit patterns 222 being radio frequency circuit patterns, to avoid the closed loop dummy pattern 224 interfering signals of the radio frequency circuit patterns.

In summary, the present invention disposes the closed loop dummy pattern (closed loop pattern) between the adjacent circuit patterns, and the closed loop dummy pattern is electrically insulated from other elements, to solve the problem of concentrating the stresses in the periphery of the circuit patterns to disrupt or distort the circuit patterns. Therefore, the present invention can improve effectively the mechanical strength of the semiconductor circuit structure to increase the manufacturing yield thereof.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a semiconductor circuit, comprising:
    forming a plurality of circuit patterns within a dielectric layer disposed on a substrate, wherein a first distance is a largest distance between a pair of the circuit patterns including any one of the circuit patterns and one of other circuit patterns adjacent thereto; and
    determining whether the first distance is larger than a first critical value, wherein,
    if the first distance is larger than the first critical value, at least a closed loop dummy pattern is formed in one of areas corresponding to the first distance between the adjacent circuit patterns, the at least a closed loop dummy pattern is disposed in the same dielectric layer with the pair of the circuit patterns, surrounds a portion of the dielectric layer and is electrically insulated from all the circuit patterns within the same dielectric layer.

2. The method of manufacturing the semiconductor circuit as claimed in claim 1, wherein a second distance is between any one of the pair of the circuit patterns and the other circuit patterns adjacent thereto, the second distance is less than the first critical value, the layout method further comprises determining whether the second distance is larger than a second critical value,
    when the second distance is larger than the second critical value, the layout method further comprises putting at least a linear pattern corresponding to the second distance, the linear pattern is connected with the at least a closed loop dummy pattern.

3. The method of the manufacturing semiconductor circuit as claimed in claim 1, further comprising determining whether a width of an area surrounded by the at least a closed loop dummy pattern is larger than the first critical value, wherein if the width is larger than the first critical value, at least a dummy pattern is put in the area.

4. The method of manufacturing the semiconductor circuit as claimed in claim 3, wherein the step of putting the at least a dummy pattern further comprises connecting the at least a dummy pattern with the at least a closed loop dummy pattern.

5. The method of manufacturing the semiconductor circuit as claimed in claim 3, wherein the step of putting the at least a dummy pattern, further comprises separating the at least a dummy pattern from the at least a closed loop dummy pattern.

6. The method of manufacturing the semiconductor circuit as claimed in claim 3, wherein the at least a dummy pattern is formed in a configuration of ring-shape, polygon-shape, or irregular shape.

7. The method of the manufacturing semiconductor circuit as claimed in claim 1, wherein if the first distance between at least a pair of the adjacent circuit patterns is larger than the first critical value, further comprising putting at least a dummy pattern between the at least the pair of the adjacent circuit patterns before putting the at least a closed loop dummy pattern, and the subsequent put at least a closed loop dummy pattern surrounds the at least a dummy pattern.

8. The method of the manufacturing semiconductor circuit as claimed in claim 1, further comprising putting at least a dummy pattern in an area surrounded by the at least a closed loop dummy pattern after putting the at least a closed loop dummy pattern.

9. The method of the manufacturing semiconductor circuit as claimed in clam 1, further comprising determining whether the first distance is larger than a third critical value before putting the at least a closed loop dummy pattern, wherein the third critical value is larger than the first critical value, if the first distance is larger than the third critical value, a plurality of closed loop dummy patterns are put in an area corresponding to the first distance between the pair of circuit patterns, and distances between the closed loop dummy patterns are less than the first critical value.

10. The method of the manufacturing semiconductor circuit as claimed in claim 1, further comprising putting at least a vacancy at the at least a closed loop dummy pattern.

11. A method of a manufacturing semiconductor circuit, comprising:
    forming a plurality of circuit patterns within a same dielectric layer disposed on a substrate; and
    forming at least one closed loop dummy pattern in the same dielectric layer, wherein the at least one closed loop dummy pattern is put in a region of no circuit pattern and is electrically insulated from all the plurality of circuit patterns within the same dielectric layer.

12. The method of the manufacturing semiconductor circuit as claimed in claim 11, further comprising putting another closed loop dummy pattern.

13. The method of the manufacturing semiconductor circuit as claimed in claim 12, further comprising connecting the at least one closed loop dummy pattern and the another closed loop dummy pattern.

14. The method of the manufacturing semiconductor circuit as claimed in claim 11, further comprising putting a dummy pattern inside the at least one closed loop dummy pattern.

15. The method of the manufacturing semiconductor circuit as claimed in claim 11, further comprising putting a dummy pattern outside the at least one closed loop dummy pattern.

16. The method of the manufacturing semiconductor circuit as claimed in claim 15, further comprising connecting the dummy pattern and the at least one closed loop dummy pattern.

17. The method of the manufacturing semiconductor circuit as claimed in claim 11, wherein the at least one closed loop dummy pattern is formed in a configuration of ring-shape, polygon-shape, or irregular shape.

18. The method of the manufacturing semiconductor circuit as claimed in claim 11, further comprising putting at least a vacancy into the at least one closed loop dummy pattern.

\* \* \* \* \*